(12) United States Patent
Ogura et al.

(10) Patent No.: US 9,054,152 B2
(45) Date of Patent: Jun. 9, 2015

(54) SEMICONDUCTOR DEVICE (71) Applicant: KABUSHIKI KAISHA TOSHIBA, Tokyo (JP)

(72) Inventors: Tsuneo Ogura, Kanagawa (JP); Kazutoshi Nakamura, Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/194,378

(22) Filed: Feb. 28, 2014

(65) Prior Publication Data
US 2015/0021655 A1     Jan. 22, 2015

(30) Foreign Application Priority Data

Jul. 18, 2013   (JP) .................. 2013-149748

(51) Int. Cl.
H01L 29/66 (2006.01)
H01L 29/739 (2006.01)
(52) U.S. Cl.
CPC ................... H01L 29/7395 (2013.01)
(58) Field of Classification Search
CPC .................................... H01L 29/7395
USPC .............................................. 257/139
See application file for complete search history.

(56) References Cited

U.S. PATENT DOCUMENTS

2008/0173893 A1   7/2008   Hamaguchi et al.
2010/0230716 A1   9/2010   Naijo

FOREIGN PATENT DOCUMENTS

| JP | H05003205 A | 1/1993 |
| JP | 2003-318400 A | 11/2003 |
| JP | 2008181975 A | 8/2008 |
| JP | 2010219088 A | 9/2010 |
| JP | 2012099630 A | 5/2012 |

Primary Examiner — Douglas Menz
(74) Attorney, Agent, or Firm — Patterson & Sheridan, LLP (57) ABSTRACT

A semiconductor device includes a first semiconductor region of a first conductivity type, a second semiconductor region of a second conductivity type on the first semiconductor region, a third semiconductor region of the first conductivity type on the second semiconductor region, a control electrode disposed within and insulated from the first, second, and third semiconductor regions, a first electrode electrically connected with the second and third semiconductor regions, a second electrode, and a fourth semiconductor region of the second conductivity type between the second electrode and the first semiconductor region. The fourth semiconductor region includes a first portion having a first dopant concentration and a second portion having a second dopant concentration higher than the first dopant concentration, and a contact area of the first portion with the second electrode is larger than a contact area of the second area with the second electrode.

20 Claims, 10 Drawing Sheets

SEMICONDUCTOR DEVICE

CROSS-REFERENCE TO RELATED APPLICATION

This application is based upon and claims the benefit of priority from Japanese Patent Application No. 2013-149748, filed Jul. 18, 2013, the entire contents of which are incorporated herein by reference.

FIELD

Embodiments described herein relate to a semiconductor device.

BACKGROUND

In general, it is desirable for a semiconductor device which is used as a switch to have low ON resistance and exhibit a small switching loss. Recently, an Insulated Gate Bipolar Transistor (IGBT) has become popular as a power semiconductor device having high breakdown strength (600 volts (V) or more, for example).

In the IGBT, when a positive bias with respect to an emitter electrode is applied to a gate electrode, an inversion layer is formed on a surface of a gate oxide film of a p-type base layer so that electrons are injected into an $n^-$-type base layer. Due to such injection, the IGBT is brought into an ON state. When the IGBT is in a steady ON state, electrons and holes are stored in the $n^-$-type base layer, and an ON voltage is reduced in accordance with an amount of the stored electrons and holes.

When the bias applied to the gate electrode is released with the IGBT in a turn-off switching state, the injection of electrons is stopped. Then, a depletion layer is formed at a pn junction between the p-type base layer and the $n^-$-type base layer, and the depletion layer spreads toward a $p^+$-type collector layer while discharging stored carriers. When a collector voltage becomes equal to a power source voltage, carriers remaining in the $n^-$-type base layer in the vicinity of the $p^+$-type collector layer generate a tail current thus increasing a turn-off switching loss. Accordingly, to reduce a switching loss, it is important to suppress the storage of carriers in a $p^+$-type collector layer side of the $n^-$-type base layer while the IGBT is in a steady ON state.

DETAILED DESCRIPTION

According to an embodiment, there is provided a semiconductor device which can reduce a switching loss at the time of turning off the semiconductor device.

In general, according to one embodiment, a semiconductor device includes a first semiconductor region of a first conductivity type, a second semiconductor region of a second conductivity type on the first semiconductor region, a third semiconductor region of the first conductivity type on the second semiconductor region, a control electrode disposed within the first, second, and third semiconductor regions, an insulating film between the control electrode and the first, second, and third semiconductor regions, a first electrode electrically connected with the second semiconductor region and the third semiconductor region, a second electrode, and a fourth semiconductor region of the second conductivity type between the second electrode and the first semiconductor region and electrically connected with the second electrode. The fourth semiconductor region includes a first portion having a first dopant concentration and a second portion having a second dopant concentration higher than the first dopant concentration, and an area of contact of the first portion with the second electrode is larger than an area of contact of the second area with the second electrode.

Hereinafter, embodiments are explained in conjunction with the drawings. In the description hereinafter, identical parts are given the same symbols, and the description of the identical parts which have been explained once is omitted as needed.

In the explanation made hereinafter, the indications "$n^+$", "n", "$n^-$" and "$p^+$", "p", "$p^-$" express relative magnitudes of dopant concentrations of respective conductivity types. That is, "$n^+$" indicates that n-type dopant concentration is relatively higher than that of "n", and "$n^-$" indicates that n-type dopant concentration is relatively lower than that of "n". "$p^+$" indicates that p-type dopant concentration is relatively higher than that of "p", and "$p^-$" indicates that p-type dopant concentration is relatively lower than that of "p".

In the description hereinafter, as one example, a specific example is explained where a first conductivity type is an n-type, and a second conductivity type is a p-type.

First Embodiment

Figure 1A:
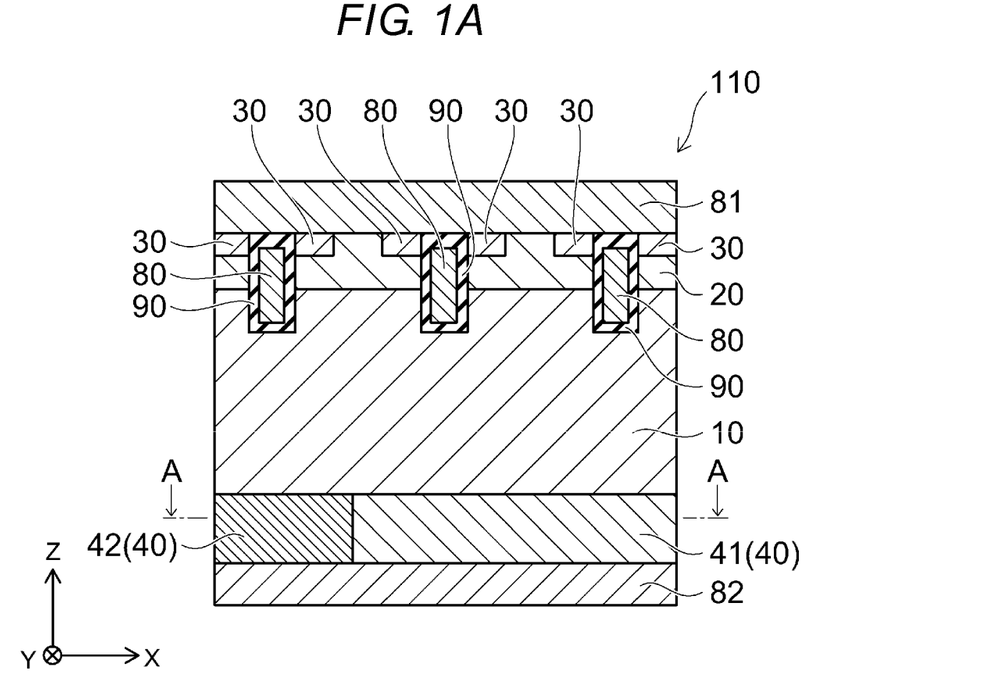
FIG. 1A and FIG. 1B are schematic views depicting a semiconductor device of a first embodiment.
Figure 1B:
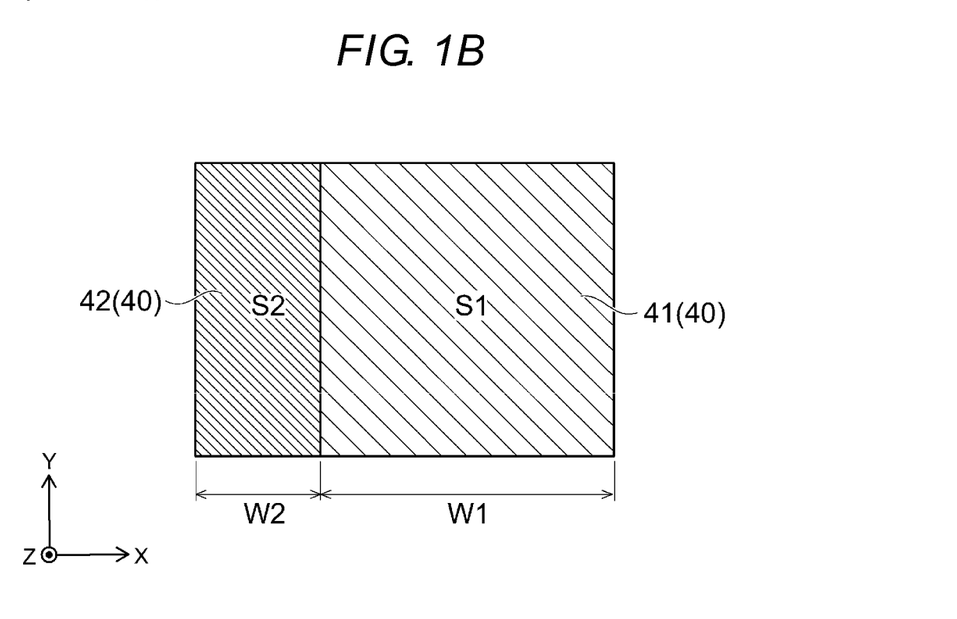

FIG. 1A and FIG. 1B are schematic views depicting the constitution of a semiconductor device of the first embodiment.

FIG. 1A is a schematic cross-sectional view showing a semiconductor device 110 of the first embodiment. FIG. 1B is a schematic cross-sectional view taken along a line A-A in FIG. 1A.

As shown in FIG. 1A, the semiconductor device 110 of the first embodiment includes: an $n^-$-type base layer 10 which constitutes a first semiconductor region of a first conductivity type; a p-type base layer 20 which constitutes a second semiconductor region of a second conductivity type; $n^+$-type emitter layers 30 which constitute third semiconductor regions of a first conductivity type; a p-type collector layer 40 which constitutes a fourth semiconductor region of a second conductivity type; gate electrodes 80 which constitute control electrodes; an emitter electrode 81 which constitutes a first electrode; and a collector electrode 82 which constitutes a second electrode.

The n⁻-type base layer 10 is a layer where silicon (Si) is doped with n-type dopant (phosphorus (P), arsenic (As), for example), for example.

The p-type base layer 20 is formed on the n⁻-type base layer 10. As described herein, the direction along which the n⁻-type base layer 10 and the p-type base layer 20 are bonded to each other is referred to as the Z direction, one of the directions which are orthogonal to the Z direction is referred to as the X direction, and the direction which is orthogonal to the Z direction and the X direction is referred to as the Y direction.

The p-type base layer 20 is formed by injecting p-type dopant (boron (B), aluminum (Al), for example) into a surface portion of the n⁻-type base layer 10 by ion implantation. The p-type base layer 20 may be formed on the n⁻-type base layer 10 by epitaxial growth, for example.

The n⁺-type emitter layers 30 are formed on the p-type base layer 20. The n⁺-type emitter layers 30 are formed on portions of the p-type base layer 20. A depth (length in the Z direction) of the n⁺-type emitter layer 30 is smaller than a depth of the p-type base layer 20. The n⁺-type emitter layers 30 are formed by injecting n-type dopant (P, As, for example) into a surface portion of the p-type base layer 20 by ion implantation. The n⁺-type emitter layers 30 may be formed on the p-type base layer 20 by epitaxial growth, for example. A portion of the p-type base layer 20 is arranged between the n⁻-type base layer 10 and the n⁺-type emitter layer 30 in the Z direction.

A length (height in the Z direction) of the n⁻-type base layer 10 is designed according to a desired breakdown strength, for example, and is approximately equal to or larger than 50 micrometers (μm) and equal to or smaller than 500 μm.

The gate electrode 80 controls the conduction between the n⁺-type base layer 10 and the n⁺-type emitter layer 30. A gate insulation film 90 is formed between the gate electrode 80 and the p-type base layer 20. The gate electrode 80 extends in the Y direction, for example. The semiconductor device 110 includes a plurality of gate electrodes 80. The plurality of gate electrodes 80 are arranged in the X direction with a predetermined interval. The gate electrode 80 extends also in the Z direction, for example. The gate electrode 80 of the semiconductor device 110 may adopt the trench gate structure, for example.

The emitter electrode 81 is electrically connected to the p-type base layer 20 and the n⁺-type emitter layer 30. The emitter electrode 81 is in ohmic contact with the p-type base layer 20 and the n⁺-type emitter layer 30, for example.

The p-type collector layer 40 is formed between the n⁻-type base layer 10 and the collector electrode 82. The p-type collector layer 40 is formed by injecting p-type dopant (B, Al, for example) into a back surface portion of the n⁻-type base layer 10 by ion implantation. The p-type collector layer 40 may be formed on a back surface of the n⁻-type base layer 10 by epitaxial growth, for example. A thickness of the p-type collector layer 40 (length in the Z direction) is set equal to or smaller than 10 μm, for example, and is preferably set equal to or smaller than 2 μm.

The p-type collector layer 40 is electrically connected to the collector electrode 82. The collector electrode 82 is in ohmic contact with the p-type collector layer 40, for example. One example of the semiconductor device 110 having the configuration described above is an IGBT.

In the semiconductor device 110, the p-type collector layer 40 includes a low concentration p⁻-type collector region 41 which constitutes a first portion and a high concentration p⁺-type collector region 42 which constitutes a second portion. The low concentration p⁻-type collector region 41 has a first dopant concentration of p-type dopant. The high concentration p⁺-type collector region 42 has a second dopant concentration of p-type dopant. The second dopant concentration is higher than the first dopant concentration.

A peak value (maximum value) of the first dopant concentration, which is the dopant concentration in the low concentration p⁻-type collector region 41, is equal to or higher than $1 \times 10^{16}$ cm⁻³ and equal to or lower than $1 \times 10^{18}$ cm⁻³, for example. A peak value (maximum value) of the second dopant concentration, which is the dopant concentration in the high concentration p⁺-type collector region 42, is equal to or higher than $1 \times 10^{18}$ cm⁻³ and equal to or lower than $1 \times 10^{20}$ cm⁻³, for example.

In one example of the semiconductor device 110, the low concentration p⁻-type collector region 41 may be formed of either one region or a plurality of regions. In one example of the semiconductor device 110, the high concentration p⁺-type collector region 42 may be formed of either one region or a plurality of regions. The high concentration p⁺-type collector region 42 may extend in a stripe shape in the X direction or in the Y direction, or may be formed in an island shape along an XY surface.

As shown in FIG. 1B, the low concentration p⁻-type collector region 41 has a first contact area S1 with the collector electrode 82. The high concentration p⁺-type collector region 42 has a second contact area S2 with the collector electrode 82. The second contact area S2 is smaller than the first contact area S1. In the case where a plurality of low concentration p⁻-type collector regions 41 are formed in one semiconductor device 110, the first contact area S1 is the total of the contact areas of the plurality of low concentration p⁻-type collector regions 41 which are in contact with the collector electrode 82. In the same manner, in the case where a plurality of high concentration p⁺-type collector regions 42 are formed in one semiconductor device 110, the second contact area S2 is the total of the contact areas of the plurality of the high concentration p⁺-type collector regions 42 which are in contact with the collector electrode 82.

Next, the manner of operation of the semiconductor device 110 is explained.

In a state where a high potential is applied to the collector electrode 82 shown in FIG. 1A and a low potential which is lower than the potential applied to the collector electrode 82 is applied to the emitter electrode 81, when a gate potential equal to or larger than a threshold value is applied to the gate electrode 80, an inversion layer (channel) is formed in the p-type base layer 20 in the vicinity of an interface between the p-type base layer 20 and the gate insulation film 90.

In one example, a ground potential or a negative potential is applied to the emitter electrode 81, a positive potential is applied to the gate electrode 80, and the positive potential higher than the potential applied to the emitter electrode 81 is applied to the collector electrode 82. Due to such applying of potentials, electrons are injected into the n⁻-type base layer 10 from the n⁺-type emitter layer 30 through a channel and, further, holes are injected into the n⁻-type base layer 10 from the p-type collector layer 40 so that the semiconductor device 110 is brought into an ON state. The holes injected into the n⁻-type base layer 10 flow into the emitter electrode 81 through the p-type base layer 20. In a steady ON state, electrons and holes are stored in the n⁻-type base layer 10 so that conductivity changes to reduce the resistance of the n⁻-type base layer 10. That is, an ON voltage is reduced in accordance with a stored amount of electrons and holes.

On the other hand, when a gate potential applied to the gate electrode 80 is lowered to a level below the threshold value from the level in an ON state, the channel in the p-type base layer 20 at the position in the vicinity of an interface between the p-type base layer 20 and the gate insulation film 90 disappears so that the injection of electrons is stopped and hence, the semiconductor device 110 is brought into an OFF state. In a state where the semiconductor device 110 is switched to an OFF state from an ON state (i.e., turn-off switching state), a depletion layer is formed by a pn junction between the p-type base layer 20 and the $n^-$-type base layer 10, and spreads toward the p-type collector layer 40 while the stored carriers are discharged.

In a turn-off switching state, when a collector voltage becomes a power source voltage, carriers which remain in the $n^-$-type base layer 10 at the position in the vicinity of the p-type collector layer 40 cause a tail current to be generated. The tail current increases a switching loss at the time of turning off the semiconductor device 110. Accordingly, in a steady ON state, it is important to reduce stored carriers in the $n^-$-type base layer 10 on a side of the p-type collector layer 40 as a way to reduce the switching loss.

Figure 2:
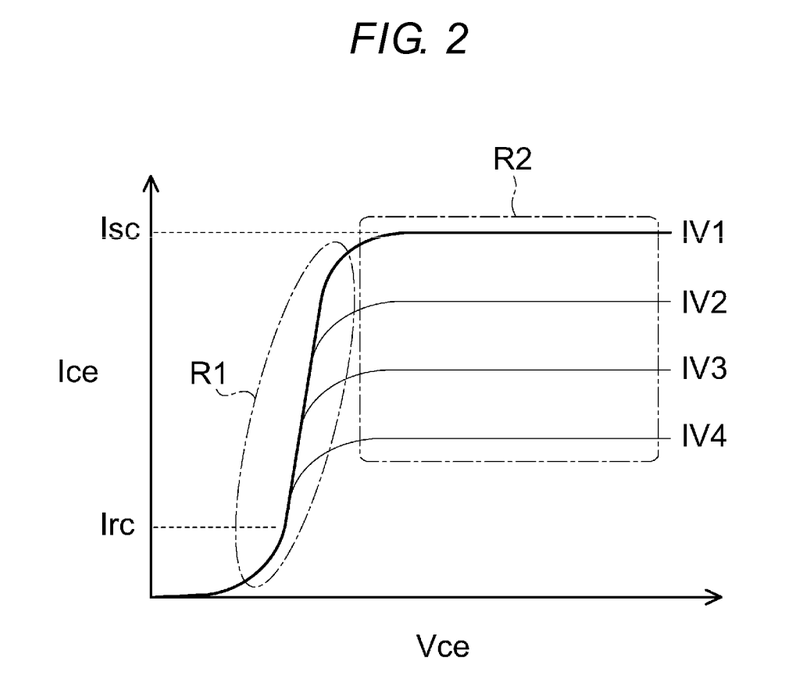
FIG. 2 is a graph depicting characteristics of the semiconductor device.

FIG. 2 is a graph depicting characteristics of the semiconductor device.

In the graph of FIG. 2, the abscissa represents a collector-emitter voltage Vce, and the ordinate represents a collector-emitter current Ice. As shown in FIG. 2, characteristics IV1 to IV4 of the semiconductor device 110 depend on a gate voltage. In this embodiment, a region where a collector-emitter current Ice is increased along with the increase of a collector-emitter voltage Vce is referred to as a saturation region R1, and a region where a collector-emitter current Ice is not increased even when a collector-emitter voltage Vce is increased is referred to as an active region R2. An electric current at which a collector-emitter current Ice does not increase any more even when a collector-emitter voltage Vce is increased is referred to as a saturation current Isc.

The semiconductor device 110 is used within the saturation region R1 for lowering an ON voltage. Accordingly, a rated current (an electric current with which the semiconductor device 110 as designed is operable in a stable manner) Irc of the semiconductor device 110 is set within the saturation region R1. For example, the rated current Irc is approximately equal to or higher than 1/100 of the saturation current Isc and equal to or smaller than 1/5 of the saturation current Isc.

To reduce stored carriers in the $n^-$-type base layer 10 on the side of the p-type collector layer 40 in a steady ON state of the semiconductor device 110 from a viewpoint of lowering a switching loss, the ruggedness of the semiconductor device 110 in a short-circuited state is lowered.

It is usually necessary for the semiconductor device 110 formed of an IGBT or the like to have a short circuit safe operating area (SCSOA) by which the semiconductor device 110 is not broken even when a short-circuit current flows at the time of short-circuiting. In this embodiment, a short-circuited state means a state where a gate voltage is applied when a load or the like connected to the semiconductor device 110 is short-circuited.

In a short-circuited state, a voltage power source and the semiconductor device 110 are directly connected to each other so that an electric current flows in a state where a power source voltage is applied to the semiconductor device 110. In this case, the power source voltage is directly applied to the semiconductor device 110 and hence, an electric current becomes a saturation current of the semiconductor device 110. When an amount of carriers in the semiconductor device 110 on the collector side is small, an applied electric field is increased on the collector side so that there exists a possibility that carriers attributed to avalanche are generated on the collector side leading to breaking of the semiconductor device 110.

That is, to reduce a switching loss of the semiconductor device 110, it is effective to lower a tail current by reducing carriers on the collector side. As described previously, however, there exists the reciprocal relationship that when the amount of carriers is small, the SCSOA is deteriorated. The semiconductor device 110 of this embodiment adopts the structure where the injection of holes is suppressed at the time the semiconductor device 110 is in a steady ON state, while the injection of holes is accelerated when a saturation current flows. By adopting such structure, the semiconductor device 110 can reduce a switching loss and can improve its ruggedness against short-circuiting.

Figure 3:
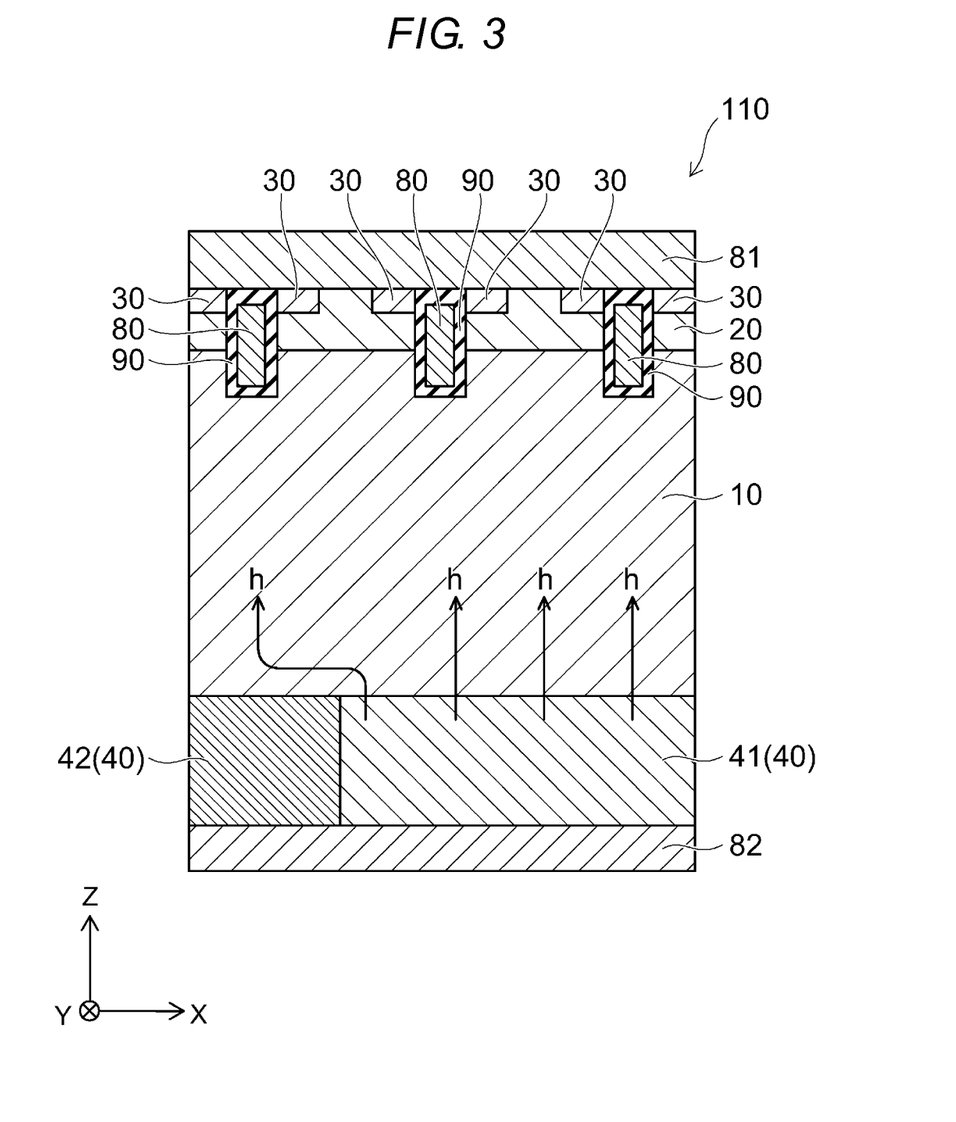
FIG. 3 is a schematic cross-sectional view depicting flow of holes in a steady ON state.

FIG. 3 is a schematic cross-sectional view depicting the flow of holes in a steady ON state.

When the semiconductor device 110 is in a steady ON state, holes h are injected mainly from the low concentration $p^-$-type collector region 41 of the p-type collector layer 40. A peak value (maximum value) of the dopant concentration in the low concentration $p^-$-type collector region 41 is equal to or higher than $1 \times 10^{16}$ cm$^{-3}$ and equal to or lower than $1 \times 10^{18}$ cm$^{-3}$, for example. Due to such peak current setting, an amount of injected holes in an ON state using a steady current can be suppressed and hence, a switching time can be shortened.

On the other hand, a peak value (maximum value) of the dopant concentration in the high concentration $p^+$-type collector region 42 is equal to or higher than $1 \times 10^{18}$ cm$^{-3}$ and equal to or lower than $1 \times 10^{20}$ cm$^{-3}$, for example. By providing such a high concentration $p^+$-type collector region 42, an internal potential between the $n^-$-type base layer 10 and the high concentration $p^+$-type collector region 42 becomes larger than an internal potential between the $n^-$-type base layer 10 and the low concentration $p^-$-type collector region 41 and hence, holes h are not substantially injected from the high concentration $p^+$-type collector region 42.

That is, by providing the high concentration $p^+$-type collector region 42, holes are injected from substantially only the low concentration $p^-$-type collector region 41. In this case, the low concentration $p^-$-type collector region 41 has small hole injection efficiency and hence, an amount of stored carriers in a steady ON state is reduced. Accordingly, a tail current is reduced leading to the reduction in the switching loss.

The contact area S2 of the high concentration $p^+$-type collector region 42 is sufficiently smaller than the contact area S1 of the low concentration $p^-$-type collector region 41. Accordingly, even when the high concentration $p^+$-type collector region 42 is provided to the p-type collector layer 40, the $p^+$-type collector region 42 does not largely influence the ON voltage.

Figure 4:
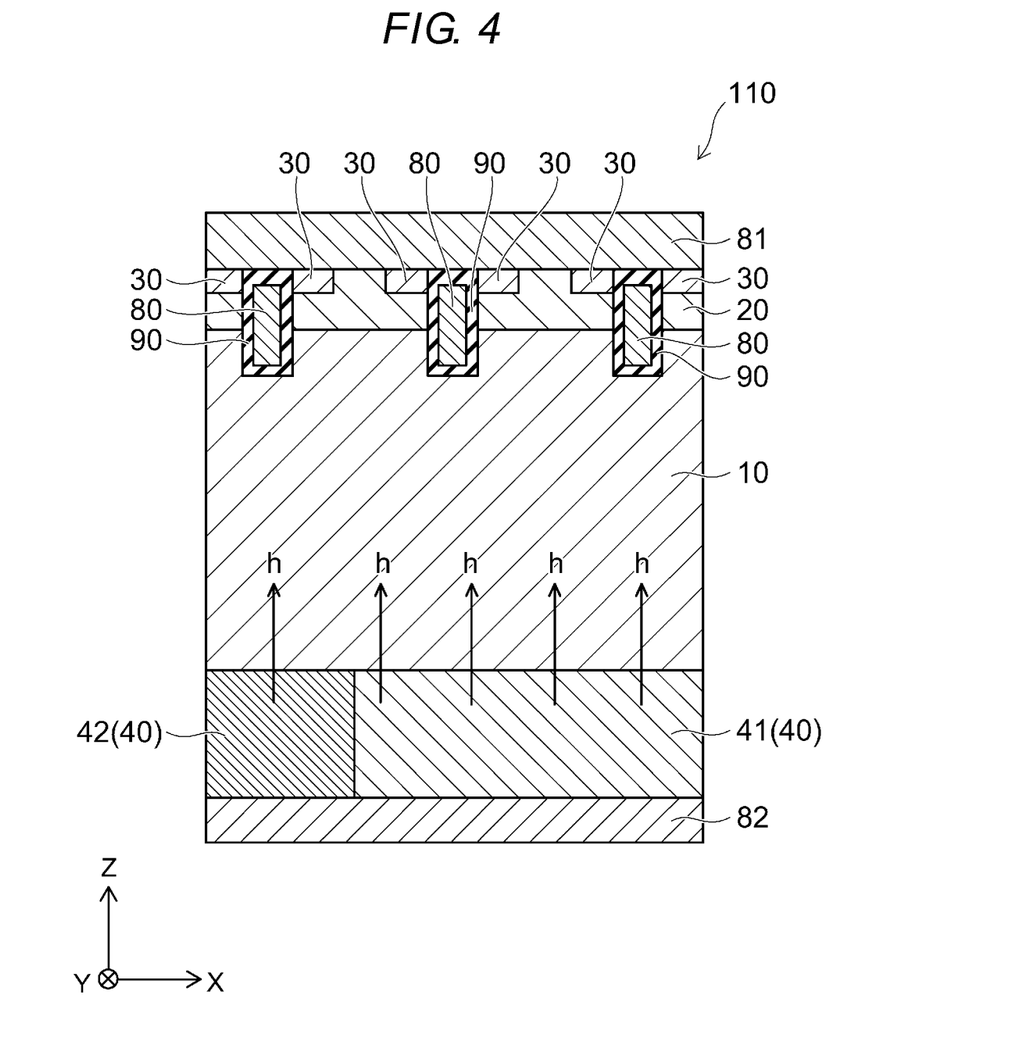
FIG. 4 is a schematic cross-sectional view depicting flow of holes in a short-circuited state.

FIG. 4 is a schematic cross-sectional view depicting a flow of the holes in a short-circuited state.

When the semiconductor device 110 is brought into a short-circuited state, a voltage applied to the load is applied to the semiconductor device 110 so that a large short-circuit current (an electric current approximately 10 or more times larger than an electric current in a steady ON state, for example) flows through the semiconductor device 110.

When the semiconductor device 110 is brought into such a short-circuited state, an amount of holes h injected into the $n^-$-type base layer 10 from the high concentration $p^+$-type collector region 42 of the p-type collector layer 40 is increased. The holes h exceed an internal potential between the n⁻-type base layer 10 and the high concentration p⁺-type collector region 42, and are injected into the n⁻-type base layer 10. That is, in a short-circuited state, the high concentration p⁺-type collector region 42 plays a role of increasing the injected amount of holes with a saturation current Isc. In a short-circuited state, holes are injected not only from the low concentration p⁻-type collector region 41 of the p-type collector layer 40 but also from the high concentration p⁺-type collector region 42 of the p-type collector layer 40. A larger amount of holes is injected from the high concentration p⁺-type collector region 42 than from the low concentration p⁻-type collector region 41 and hence, it is possible to suppress an electric field in the n⁻-type base layer 10 on a side of the p-type collector layer 40 from being increased. Accordingly, the ruggedness of the semiconductor device 110 against short-circuiting is enhanced.

Figure 5:
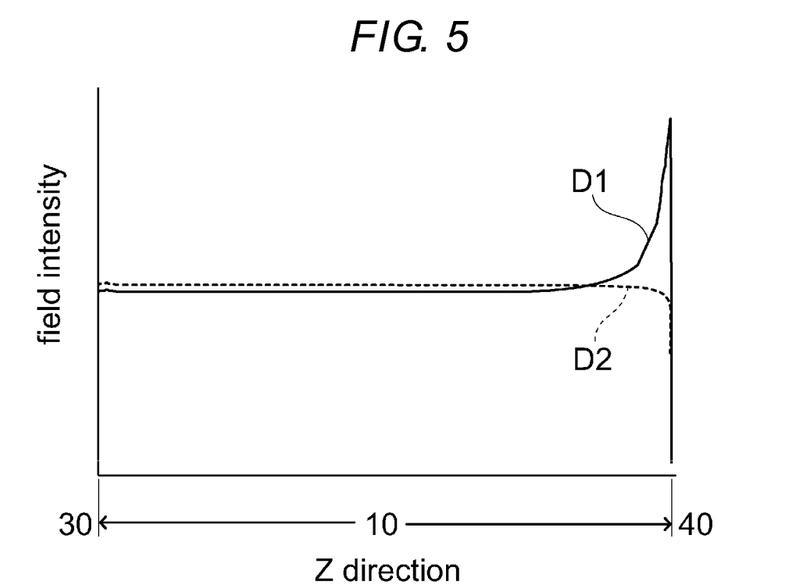
FIG. 5 is a graph depicting an electric field distribution in a short-circuited state.

FIG. 5 is a graph depicting the distribution of an electric field in a short-circuited state obtained by a simulation calculation.

In the graph of FIG. 5, the abscissa represents a position in the depth direction (Z direction) in the n⁻-type base layer 10, and the ordinate represents an electric field intensity. The graph of FIG. 5 shows the distribution of an electric field D1 in the case where the high concentration p⁺-type collector region 42 is not provided to the semiconductor device 110, and the distribution of an electric field D2 in the case where the high concentration p⁺-type collector region 42 is provided to the semiconductor device 110.

As shown in FIG. 5, in a short-circuited state, in the distribution of an electric field D1 in the case where the high concentration p⁺-type collector region 42 is not provided to the semiconductor device 110, an electric field in the n⁻-type base layer 10 on the side of the p-type collector layer 40 is high. On the other hand, in a short-circuited state, in the distribution of an electric field D2 in the case where the high concentration p⁺-type collector region 42 is provided to the semiconductor device 110, an electric field in the n⁻-type base layer 10 on the side of the p-type collector layer 40 side is lower than that in the distribution of an electric field D1. This is because, in a short-circuited state, holes are injected into the n⁻-type base layer 10 from the high concentration p⁺-type collector region 42 so that the distribution of an electric field is gentle. In the semiconductor device 110 provided with the high concentration p⁺-type collector region 42, in a short-circuited state, the distribution of an electric field in the n⁻-type base layer 10 on the side of the p-type collector layer 40 is gentle and hence, the ruggedness against short-circuiting may be enhanced.

When an area or a width of the high concentration p⁺-type collector region 42 is increased, the effect of suppressing an amount of holes injected in an ON state with a steady current is decreased thus adversely influencing high-speed switching. Accordingly, one of the enhancement of the ruggedness against short-circuiting and high-speed switching needs to be sacrificed. Under such circumstances, inventors of the embodiment have newly found the structure by which an injection amount of holes can be suppressed in an ON state, and the injection of holes can be accelerated when a saturation current flows through the semiconductor device.

The condition adopted by the structure is that at least the relationship $S2<S1$ is satisfied, wherein S1 represents a first contact area, and S2 represents a second contact area. The more preferred condition is that the relationship $S2/(S1+S2) \leq Irc/Isc$ is satisfied, wherein Irc represents a rated current of the semiconductor device 110 and Isc represents a saturation current of the semiconductor device 110.

To be more specific, a saturation current Isc is usually approximately 5 times or more and 100 times or less larger than a rated current Irc. Accordingly, it is desirable that the relationship $S2/(S1+S2)$ be equal to or smaller than ⅕ at maximum.

The operation mechanism when the above-mentioned relationship is satisfied is as follows.

For example, when a saturation current Isc is 5 times larger than a rated current Irc, provided that an area or a width of the high concentration p⁺-type collector region 42 is ⅕ or less of the total area or the total width of the p-type collector layers 40, in a state where a rated current Irc flows through the semiconductor device 110, an electric current corresponding to ⅕ or less of the total area or the total width of the p-type collector layers 40 tends to flow through the high concentration p⁺-type collector region 42. With such a sufficiently small electric current, however, since an internal potential between the n⁻-type base layer 10 and the high concentration p⁺-type collector region 42 is larger than an internal potential between the n⁻-type base layer 10 and the low concentration p⁻-type collector region 41, the injection of holes from the high concentration p⁺-type collector region 42 is substantially ignored. Accordingly, when a rated current flows through the semiconductor device 110, only a hole current from the low concentration p⁻-type collector region 41 contributes to the conduction. Due to such an operation mechanism, an amount of holes injected in an ON state with a steady current is suppressed. That is, a high-speed switching operation can be achieved.

On the other hand, in a state where a saturation current Isc flows through the whole region of the element, an electric current which is ⅕ of the saturation current Isc, that is, a rated current Irc flows through the high concentration p⁺-type collector region 42. Accordingly, holes are injected from the high concentration p⁺-type collector region 42. In a state where a large electric current flows through the semiconductor device 110, the high concentration p⁺-type collector region 42 exhibits sufficiently large hole injection efficiency compared with the low concentration p⁻-type collector region 41. Accordingly, the distribution of an electric field in the n⁻-type base layer 10 on a p-type collector layer 40 side is gentle in a short-circuited state as shown in FIG. 5 and hence, the ruggedness against short-circuiting can be enhanced.

As shown in FIG. 1B, in the case where the low concentration p⁻-type collector region 41 and the high concentration p⁺-type collector region 42 extend in a stripe shape in the X direction or in the Y direction with a fixed width respectively, the first contact area S1 is proportional to a width (a length in the X direction) W1 of the low concentration p⁻-type collector region 41, and the second contact area S2 is proportional to a width (a length in the X direction) W2 of the high concentration p⁺-type collector region 42. Accordingly, the above-mentioned relationship formula can be expressed by $W2<W1$, and it is more preferable that the above-mentioned relationship is equivalent to $W2/(W1+W2) \leq Irc/Isc$.

As one specific example, when a width W1 of the low concentration p⁻-type collector region 41 is 4 μm and a saturation current Isc is 5 times larger than a rated current Irc, it is sufficient that a width W2 of the high concentration p⁺-type collector region 42 is equal to or smaller than 0.8 μm. When the low concentration p⁻-type collector region 41 and the high concentration p⁺-type collector region 42 have a fixed width respectively and extend in the Y direction, the first contact area S1 and the second contact area S2 are decided based on a ratio between the respective widths. On the other hand, when the high concentration p$^+$-type collector region 42 has a planar pattern of a round shape or a quadrangular shape, the first contact area S1 and the second contact area S2 are decided based on a ratio between respective areas. That is, the contact areas S1, S2 are decided substantially same manner in both cases. Even when a width or an area of each contact area S1, S2 is not uniform over the whole portion in the inside of the element and may differ in size, it is sufficient to decide the contact areas S1, S2 based on the total widths or the total areas of the contact areas S1, S2.

Figure 6:
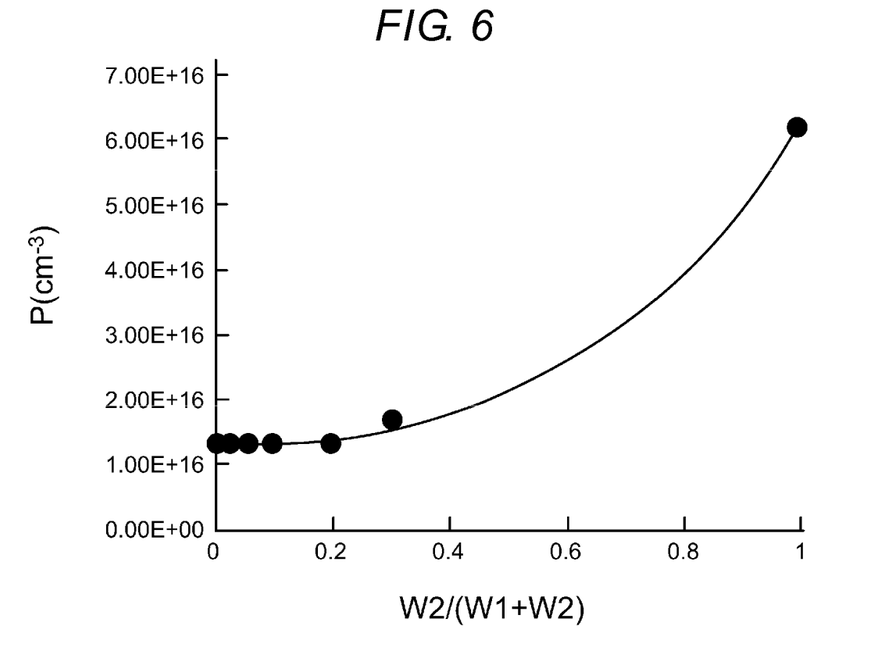
FIG. 6 is a graph depicting the relationship between a width of a high concentration region and maximum density of the holes.

FIG. 6 is a graph depicting the relationship between a width of the high concentration p$^+$-type collector region and maximum density of the holes when a rated current flows through the semiconductor device 110.

The graph of FIG. 6 shows the result of simulation calculation. In the graph of FIG. 6, the abscissa is represented by W2/(W1+W2), and the ordinate is represented by maximum hole density P(cm$^{-3}$) in the n$^-$-type base layer 10 in the vicinity of the p-type collector layer 40.

As can be understood from the graph of FIG. 6, within a range where the relationship W2<W1 is established, maximum hole density P in the vicinity of the p-type collector layer 40 is low. Further, when the relationship W2/(W1+W2) is set equal to or smaller than 0.2, that is, when the width W2 of the high concentration p$^+$-type collector region 42 is set equal to or smaller than ⅕ of the total width of collector regions (W1+W2), the maximum hole density P in the n$^-$-type base layer in the vicinity of the p-type collector layer 40 is sufficiently low. From this simulation result, it is understood that even when the high concentration p$^+$-type collector region 42 is provided to the p-type collector layer 40, a tail current at the time of turning off a switch is sufficiently lowered. With respect to a specific value of the width W2 of the high concentration p$^+$-type collector region 42, when taking into account manufacturing of the semiconductor device 110, it is difficult to narrow the width W2 too much. On the other hand, when the width W2 is excessively increased, a change in the distribution of an injection amount of holes in the chip in the lateral direction is increased. Accordingly, as a specific numerical value, the width W2 may be set approximately equal to or larger than 0.1 μm and equal to or smaller than 10 μm.

Next, one example of a manufacturing method of the semiconductor device 110 is explained.

FIG. 7A to FIG. 8C are schematic cross-sectional views depicting the manufacturing method of the semiconductor device 110.

Figure 7A:
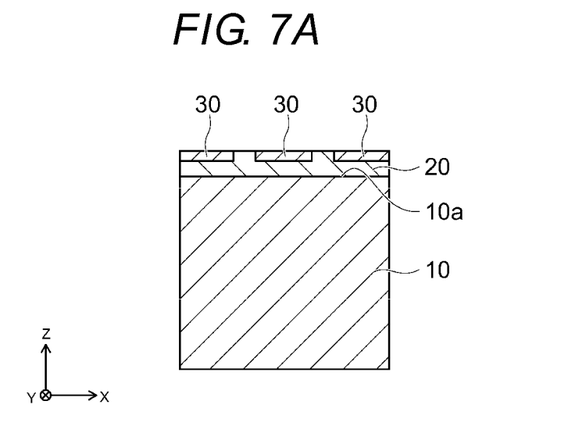
FIG. 7A to FIG. 7C are schematic cross-sectional views depicting a method of manufacturing the semiconductor device.

Firstly, as shown in FIG. 7A, the p-type base layer 20 is formed on a first surface 10a of the n$^-$-type base layer 10. For example, a Si substrate (Si wafer or the like) which is doped with n-type dopant is prepared, and p-type dopant is injected into a surface of the Si substrate thus forming the p-type base layer 20. The p-type base layer 20 may be formed by an epitaxial growth of p$^+$-type Si on the surface of the Si substrate which is doped with n-type dopant.

The dopant concentration in the n$^-$-type base layer 10 is equal to or higher than $1\times10^{13}$ cm$^{-3}$ and equal to or lower than $1\times10^{16}$ cm$^{-3}$, for example. A thickness of the n$^-$-type base layer 10 is equal to or larger than 50 μm and equal to or smaller than 500 μm, for example. A peak value of the dopant concentration in the p-type base layer 20 is equal to or higher than $1\times10^{16}$ cm$^{-3}$ and equal to or lower than $1\times10^{18}$ cm$^{-3}$, for example. A thickness of the p-type base layer 20 is equal to or larger than 0.1 μm and equal to or smaller than 5 μm, for example.

Subsequently, the n$^+$-type emitter layer 30 is formed on the p-type base layer 20. For example, the n$^+$-type emitter layer 30 is formed by injecting n-type dopant into a surface of the p-type base layer 20. The n$^+$-type emitter layer 30 may be formed by an epitaxial growth of n$^+$-type Si on the surface of the p-type base layer 20. A plurality of n$^+$-type emitter layers 30 may be formed in the X direction with a predetermined interval. A peak value of the dopant concentration in the n$^+$-type emitter layer 30 is equal to or higher than $1\times10^{18}$ cm$^{-3}$ and equal to or lower than $1\times10^{21}$ cm$^{-3}$, for example. A thickness of the n$^-$-type emitter layer 30 is equal to or larger than 0.1 μm and equal to or smaller than 5 μm, for example.

Figure 7B:
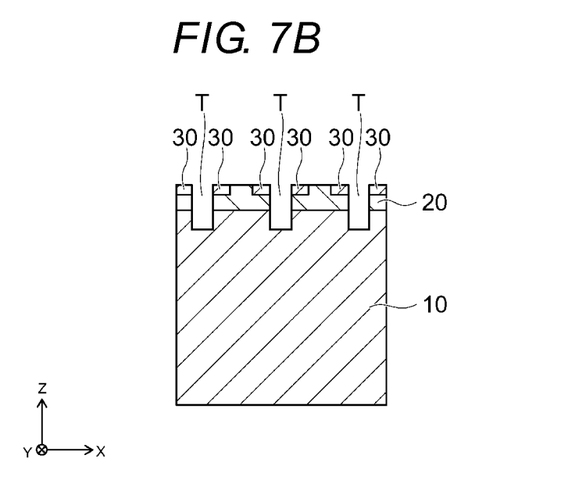

Next, as shown in FIG. 7B, a trench T is formed up to a middle portion of the n$^-$-type base layer 10 through the n$^-$-type emitter layer 30 and the p-type base layer 20. The trench T is formed by Reactive Ion Etching (RIE), for example. A plurality of trenches T may be formed in the X direction at a predetermined interval. A width of the trench T is equal to or larger than 0.1 μm and equal to or smaller than 5 μm, for example, and a depth of the trench T is equal to or larger than fpm and equal to or smaller than 10 μm, for example.

Figure 7C:
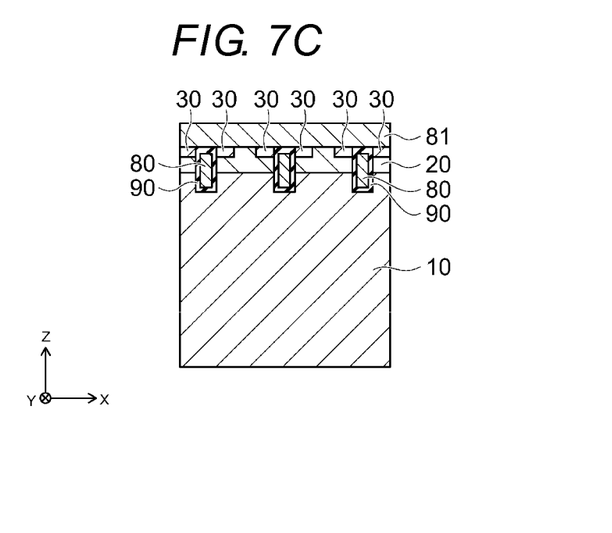

Next, as shown in FIG. 7C, the gate electrodes 80 are formed in the trench T with the gate insulation film 90 interposed between the gate electrode 80 and the corresponding trench T. For example, silicon oxide (SiO$_2$) is used for forming the gate insulation film 90. For example, polysilicon is used for forming the gate electrodes 80. Subsequently, the emitter electrode 81 is formed on the n$^-$-type emitter layers 30 and the p-type base layer 20. For example, aluminum or an aluminum alloy is used for forming the emitter electrode 81.

Figure 8A:
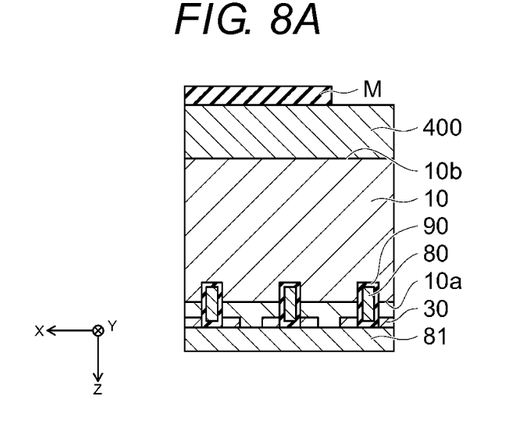
FIG. 8A to FIG. 8C are schematic cross-sectional views depicting the method of manufacturing the semiconductor device.

Next, as shown in FIG. 8A, a p$^-$-type semiconductor layer 400 is formed on a second surface 10b of the n$^-$-type base layer 10 on a side opposite to the first surface 10a. For example, the p$^-$-type semiconductor layer 400 is formed by injecting p-type dopant into the second surface 10b of the n$^-$-type base layer 10. The p$^-$-type semiconductor layer 400 may be formed by an epitaxial growth of p$^+$-type Si on the second surface 10b of the n$^-$-type base layer 10. A peak value (maximum value) of the dopant concentration in the p$^-$-type semiconductor layer 400 is equal to or higher than $1\times10^{16}$ cm$^{-3}$ and equal to or lower than $1\times10^{18}$ cm$^{-3}$, for example.

Figure 8B:
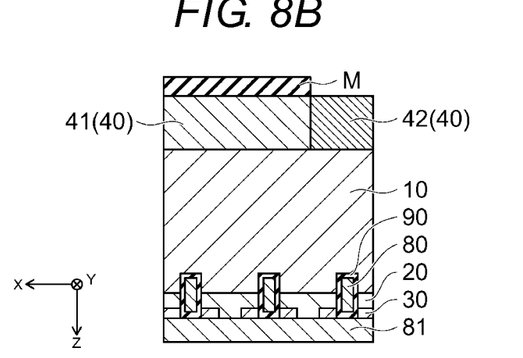

Next, a mask M is formed on a portion of the p$^-$-type semiconductor layer 400. Thereafter, p-type dopant is injected into a portion of the p$^-$-type semiconductor layer 400 using the mask M. Due to this step, as shown in FIG. 8B, the high concentration p$^+$-type collector region 42 is formed in a portion of the p$^-$-type semiconductor layer 400 which is not covered with the mask M. A portion of the p$^-$-type semiconductor layer 400 which is covered with the mask M forms the low concentration p$^-$-type collector region 41. The p-type collector layer 40 which includes the low concentration p$^-$-type collector region 41 and the high concentration p$^+$-type collector region 42 is formed in this manner. A size of the low concentration p$^-$-type collector region 41 and a size of the high concentration p$^+$-type collector region 42 are set based on a size of the mask M.

Figure 8C:
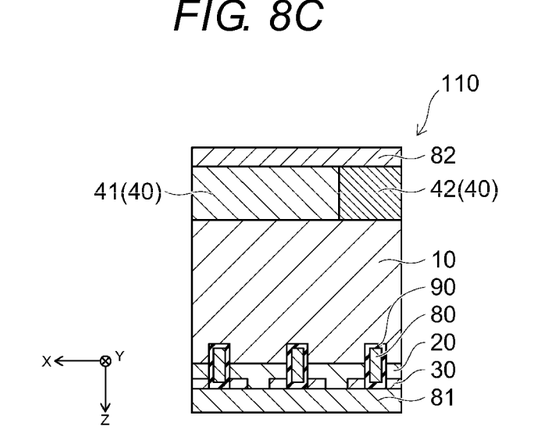

Next, as shown in FIG. 8C, the collector electrode 82 is formed on the p-type collector layer 40. For example, aluminum or an aluminum alloy is used for forming the collector electrode 82. After this step, the manufacture of the semiconductor device 110 is completed. The manufacturing method described above is merely an example and, there is no problem in changing the order of steps, provided that the semiconductor device 110 is completed eventually.

Second Embodiment

Next, a semiconductor device of the second embodiment is explained.

Figure 9:
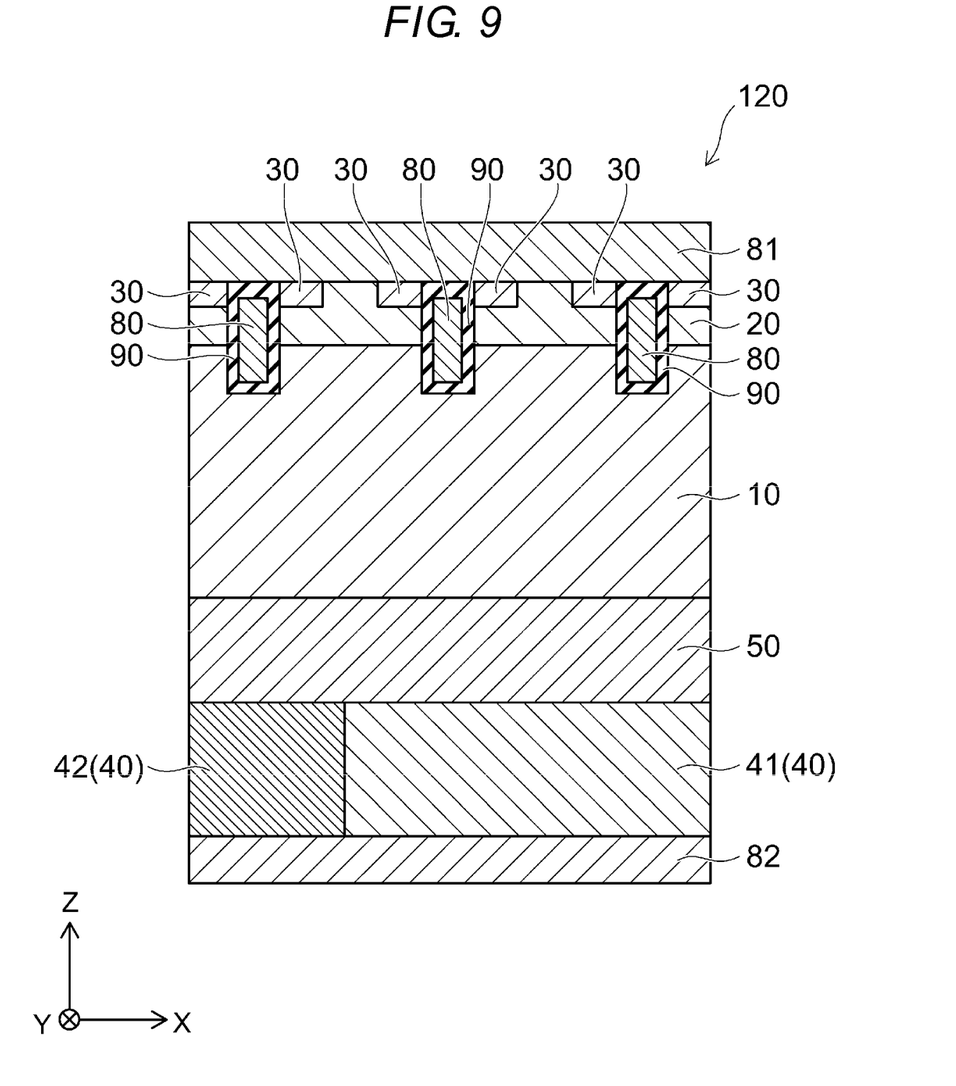
FIG. 9 is a schematic cross-sectional view depicting a semiconductor device of a second embodiment.

FIG. 9 is a schematic cross-sectional view depicting the semiconductor device of the second embodiment.

As shown in FIG. 9, a semiconductor device 120 of the second embodiment includes, in addition to the constitution of the semiconductor device 110 shown in FIG. 1, an n$^+$-type buffer layer 50 which constitutes a fifth semiconductor region.

The n$^+$-type buffer layer 50 is formed between an n$^−$-type base layer 10 and a p-type collector layer 40. The dopant concentration in the n$^+$-type buffer layer 50 is higher than the dopant concentration in the n$^−$-type base layer 10. A peak value (maximum value) of the dopant concentration in the n$^+$-type buffer layer 50 is equal to or higher than $1\times10^{15}$ cm$^{−3}$ and equal to or lower than $1\times10^{18}$ cm$^{−3}$, for example.

In the semiconductor device 120, in the same manner as the semiconductor device 110, due to the formation of a high concentration p$^+$-type collector region 42, an amount of holes injected in an ON state is suppressed so that a switching loss is reduced. On the other hand, when a saturation current flows through the semiconductor device 120, holes are injected into the n$^−$-type base layer 10 from the high concentration p$^+$-type collector region 42 and a low concentration p$^−$-type collector region 41 and hence, the ruggedness against short-circuiting can be enhanced.

Further, in the semiconductor device 120, the n$^+$-type buffer layer 50 is formed between the p-type collector layer 40 and the n$^−$-type base layer 10, so that, in an OFF state, a depletion layer rarely reaches the p-type collector layer 40 whereby a punch-through can be suppressed. That is, the semiconductor device 120 can realize an element having the same breakdown strength as the semiconductor device 110 while setting a width of the n$^−$-type base layer 10 smaller than a width of the n$^−$-type base layer 10 of the semiconductor device 110. Accordingly, the semiconductor device 120 can acquire the higher breakdown strength.

Third Embodiment

Next, a semiconductor device of the third embodiment is explained.

Figure 10:
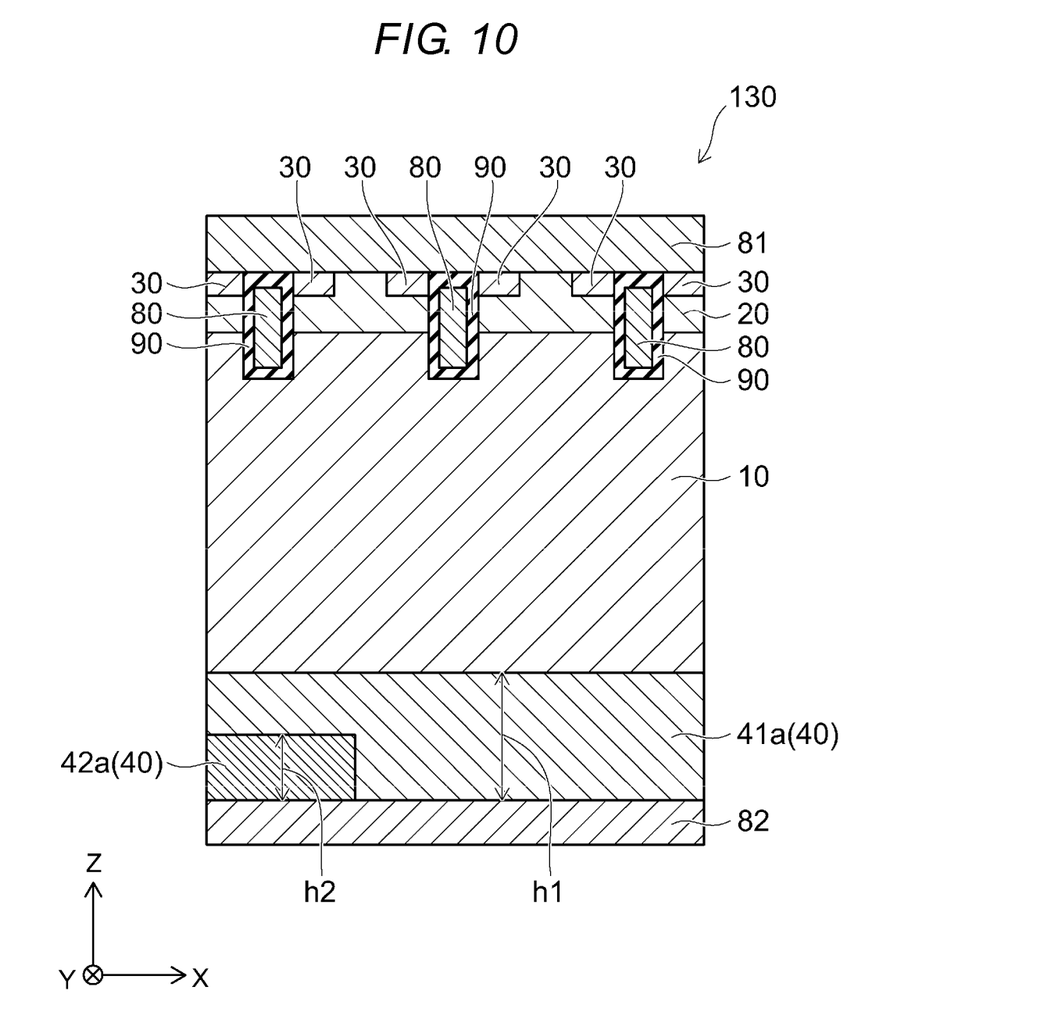
FIG. 10 is a schematic cross-sectional view depicting a semiconductor device of a third embodiment.

FIG. 10 is a schematic cross-sectional view depicting the semiconductor device of the third embodiment.

As shown in FIG. 10, the semiconductor device 130 of the third embodiment differs from the semiconductor device 110 shown in FIG. 1 with respect to the constitution of a p-type collector layer 40.

In the semiconductor device 130, the p-type collector layer 40 includes a low concentration p$^−$-type collector region 41a and a high concentration p$^+$-type collector region 42a. A thickness (a length in the Z direction) h2 of the high concentration p$^+$-type collector region 42a is smaller than a thickness (a length in the Z direction) h1 of the low concentration p$^−$-type collector region 41a. The thickness h2 of the high concentration p$^+$-type collector region 42a is, for example, approximately 10% to 80% of the thickness h1 of the low concentration p$^−$-type collector region 41a.

The high concentration p$^+$-type collector region 42a is surrounded by the low concentration p$^−$-type collector region 41a except for a surface thereof which is in contact with a collector electrode 82. In the semiconductor device 130, the high concentration p$^+$-type collector region 42a is not in contact with an n$^−$-type base layer 10.

In this manner, even when the thickness of the high concentration p$^+$-type collector region 42a is small, an injection amount of holes in an ON state can be suppressed due to the formation of the high concentration p$^+$-type collector region 42a and hence, a switching loss is reduced. On the other hand, when a saturation current flows through the semiconductor device 130, holes are injected into the n$^−$-type base layer 10 from the high concentration p$^+$-type collector region 42a through the low concentration p$^−$-type collector region 41a and hence, the ruggedness against short-circuiting can be enhanced.

Further, in the semiconductor device 130, the thickness h2 of the high concentration p$^+$-type collector region 42a is smaller than the thickness h1 of the low concentration p$^−$-type collector region 41a and hence, a fine high concentration p$^+$-type collector region 42a can be formed. Accordingly, it is possible to realize a semiconductor device which can perform a switching operation at a higher speed while maintaining the ruggedness against short-circuiting.

Fourth Embodiment

Next, a semiconductor device of the fourth embodiment is explained.

Figure 11:
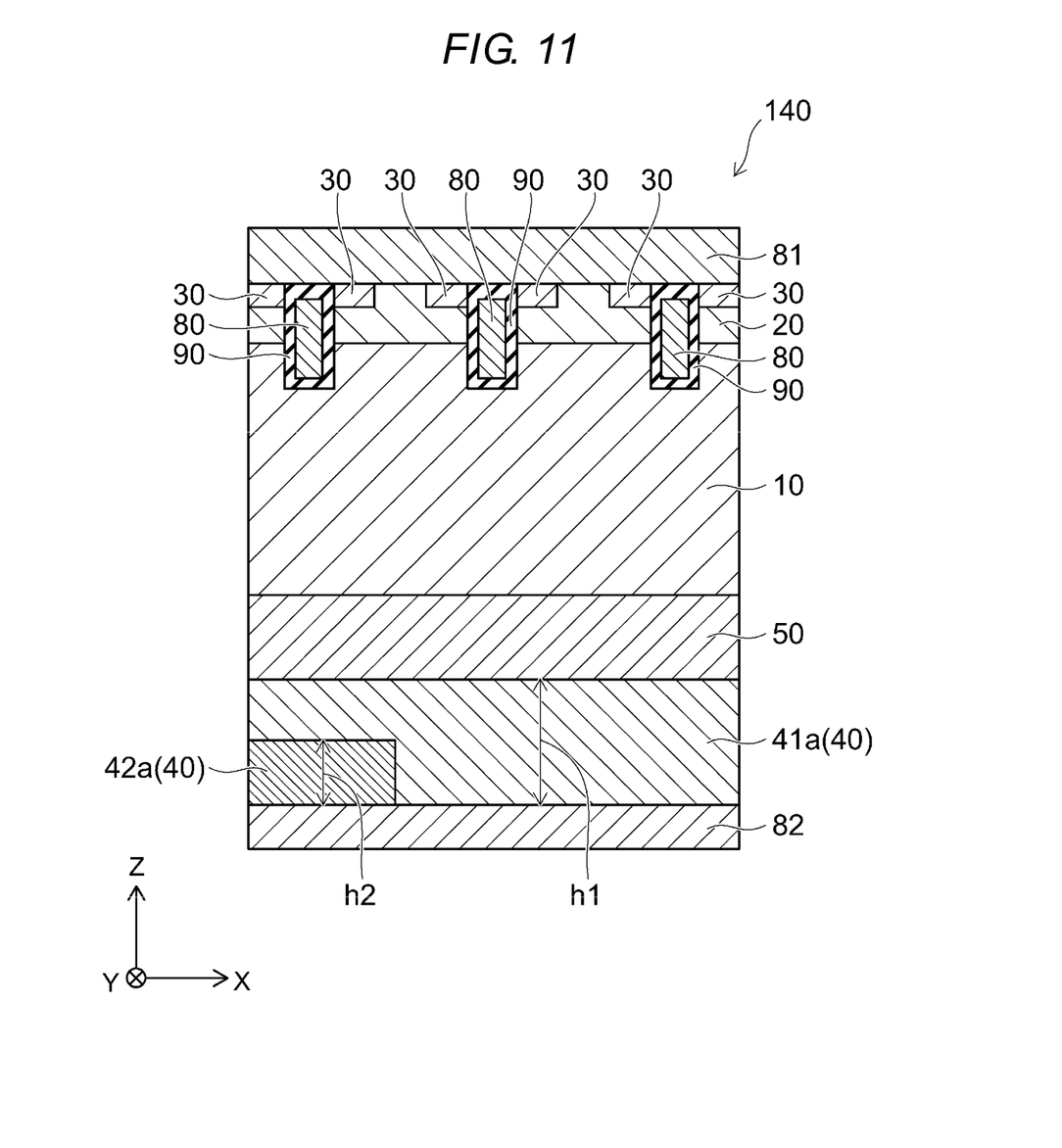
FIG. 11 is a schematic cross-sectional view depicting a semiconductor device of a fourth embodiment.

FIG. 11 is a schematic cross-sectional view depicting the semiconductor device of the fourth embodiment.

As shown in FIG. 11, a semiconductor device 140 of the fourth embodiment includes, in addition to the constitution of the semiconductor device 130 shown in FIG. 10, an n$^+$-type buffer layer 50 which constitutes a fifth semiconductor region.

The n$^+$-type buffer layer 50 is arranged between an n$^−$-type base layer 10 and a p-type collector layer 40. The dopant concentration in the n$^+$-type buffer layer 50 is higher than the dopant concentration in the n$^−$-type base layer 10. A peak value (maximum value) of the dopant concentration in the n$^+$-type buffer layer 50 is equal to or higher than $1\times10^{15}$ cm$^{−3}$ and equal to or lower than $1\times10^{18}$ cm$^{−3}$, for example.

In the semiconductor device 140, in the same manner as the semiconductor device 120, the n$^+$-type buffer layer 50 is formed between the p-type collector layer 40 and the n$^−$-type base layer 10 so that, in an OFF state, a depletion layer hardly reaches the p-type collector layer 40. Accordingly, a punch-through can be suppressed.

Further, in the semiconductor device 140, in the same manner as the semiconductor device 130, the p-type collector layer 40 includes a low concentration p$^−$-type collector region 41a and a high concentration p$^+$-type collector region 42a. A thickness (a length in the Z direction) h2 of the high concentration p$^+$-type collector region 42a is smaller than a thickness (a length in the Z direction) h1 of the low concentration p$^−$-type collector region 41a. That is, the semiconductor device 140 can realize an element having the same breakdown strength as the semiconductor device 110 while setting a width of the n$^−$-type base layer 10 smaller than a width of the n$^−$-type base layer 10 of the semiconductor device 110. Accordingly, the semiconductor device 140 can acquire a low ON voltage. Further, the semiconductor device 140 can form a fine high concentration p$^+$-type collector region 42a and hence, it is possible to realize a high-speed operation while maintaining the ruggedness against short-circuiting.

As has been explained above, according to the semiconductor device of the embodiments, a switching loss at the time of turning off a semiconductor device can be reduced.

Although the embodiments have been explained heretofore, the exemplary embodiments are not limited to these embodiments. For example, embodiments acquired as a result of applying the addition, the deletion or a change in design to the above-mentioned embodiments by a person skilled in the art or the embodiments acquired as a result of suitably combining the characteristics of the above-mentioned embodiments by a person skilled in the art also fall within the scope of the present disclosure provided that these embodiments include the gist of the present disclosure.

For example, in the previously-mentioned respective embodiments, the explanation has been made assuming that the first conductivity type is the n-type, and the second conductivity type is the p-type. However, in these exemplary embodiments, the first conductivity type may be the p-type, and the second conductivity type may be the n-type.

Further, in the previously-mentioned respective embodiments, the explanation has been made with respect to the semiconductor device which uses Si as a semiconductor. However, as a semiconductor, a compound semiconductor such as silicon carbide (SiC) or gallium nitride (GaN), or a wide band gap semiconductor such as diamond may be used, for example.

In the previously-mentioned respective embodiments, the IGBT is explained as an example of the semiconductor device. However, any semiconductor device can be used provided that the semiconductor device is a semiconductor device such as a bipolar transistor or a thyristor which performs a bipolar operation. In the bipolar transistor, a portion of the $n^+$ collector layer may be formed into a high concentration $p^+$-type collector region 42a. The structure of the gate electrode is not limited to the trench structure, and the planar structure is also applicable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first semiconductor region of a first conductivity type;
a second semiconductor region of a second conductivity type on the first semiconductor region;
a third semiconductor region of the first conductivity type on the second semiconductor region;
a control electrode disposed within the first and second semiconductor regions;
an insulating film between the control electrode and the first and second semiconductor regions;
a first electrode electrically connected with the second semiconductor region and the third semiconductor region;
a second electrode; and
a fourth semiconductor region of the second conductivity type between the second electrode and the first semiconductor region and electrically connected with the second electrode, the fourth semiconductor region including a first portion having a first dopant concentration and a second portion having a second dopant concentration higher than the first dopant concentration, wherein an area of contact of the first portion with the second electrode is larger than an area of contact of the second area with the second electrode.

2. The semiconductor device according to claim 1, wherein when an electric current smaller than a saturation current flows between the first electrode and the second electrode, carriers are injected into the first semiconductor region mostly from the first portion, and when the saturation current flows between the first electrode and the second electrode, the carriers are injected into the first semiconductor region from the first portion and the second portion.

3. The semiconductor device according to claim 2, wherein a relationship $S2/(S1+S2) \leq Irc/Isc$ is satisfied, where S1 represents the first contact area, S2 represents the second contact area, Irc represents a rated current of the semiconductor device, and Isc represents a saturation current of the semiconductor device.

4. The semiconductor device according to claim 3, wherein $S2/(S1+S2)$ is equal to or smaller than $\frac{1}{5}$.

5. The semiconductor device according to claim 4, wherein the first dopant concentration is equal to or higher than $1\times10^{16}$ cm$^{-3}$ and equal to or lower than $1\times10^{18}$ cm$^{-3}$, and
the second dopant concentration is equal to or higher than $1\times10^{18}$ cm$^{-3}$ and equal to or lower than $1\times10^{20}$ cm$^{-3}$.

6. The semiconductor device according to claim 5, wherein the first portion has a longer length in a first direction along a contact surface with the second electrode than the second portion.

7. The semiconductor device according to claim 6, wherein $W2/(W1+W2)$ is equal to or smaller than $\frac{1}{5}$, where W1 represents the length of the first portion and W2 represents the length of the second portion.

8. The semiconductor device according to claim 7, wherein the length of the second portion is equal to or larger than 0.1 micrometers and equal to or smaller than 10 micrometers.

9. The semiconductor device according to claim 1, further comprising:
a fifth semiconductor region of the first conductivity type between the first semiconductor region and the fourth semiconductor region, the fifth semiconductor region having a higher dopant concentration than the first semiconductor region.

10. The semiconductor device according to claim 1, wherein the control electrode extends between a lower portion of the first semiconductor region and an upper portion of the third semiconductor region and is insulated from the first, second, and third semiconductor region by an insulating layer.

11. A semiconductor device comprising:
a first semiconductor region of a first conductivity type;
a second semiconductor region of a second conductivity type on the first semiconductor region;
a third semiconductor region of the first conductivity type on the second semiconductor region;
a control electrode disposed within the first and second semiconductor regions;
an insulating film between the control electrode and the first and second semiconductor regions;
a first electrode electrically connected with the second semiconductor region and the third semiconductor region;
a second electrode; and
a fourth semiconductor region of the second conductivity type between the second electrode and the first semiconductor region and electrically connected with the second electrode, the fourth semiconductor region including first and second portions arranged along a first direction, the first portion having a first dopant concentration and the second portion having a second dopant concentration higher than the first dopant concentration and a shorter length in the first direction than the first portion.

12. The semiconductor device according to claim 11, wherein the first dopant concentration is equal to or higher than $1\times10^{16}$ cm$^{-3}$ and equal to or lower than $1\times10^{18}$ cm$^{-3}$, and the second dopant concentration is equal to or higher than $1\times10^{18}$ cm$^{-3}$ and equal to or lower than $1\times10^{20}$ cm$^{-3}$.

13. The semiconductor device according to claim 12, wherein

W2/(W1+W2) is equal to or smaller than ⅕, where W1 represents the length of the first portion and W2 represents the length of the second portion.

14. The semiconductor device according to claim 11, further comprising:

a fifth semiconductor region of the first conductivity type between the first semiconductor region and the fourth semiconductor region, the fifth semiconductor region having a higher dopant concentration than the first semiconductor region.

15. A semiconductor device comprising:

a first semiconductor region of a first conductivity type;

a second semiconductor region of a second conductivity type on the first semiconductor region;

a third semiconductor region of the first conductivity type on the second semiconductor region;

a control electrode disposed within the first and second semiconductor regions;

an insulating film between the control electrode and the first and second semiconductor regions;

a first electrode electrically connected with the second semiconductor region and the third semiconductor region;

a second electrode; and a fourth semiconductor region of the second conductivity type between the second electrode and the first semiconductor region and electrically connected with the second electrode, the fourth semiconductor region including a first portion having a first dopant concentration and a second portion having a second dopant concentration higher than the first dopant concentration, wherein an area of contact of the first portion with the second electrode is larger than an area of contact of the second area with the second electrode, and a height of the first portion in a direction that extends from the second electrode to the first electrode is smaller than a height of the second portion in the same direction.

16. The semiconductor device according to claim 15, wherein the first dopant concentration is equal to or higher than $1\times10^{16}$ cm$^{-3}$ and equal to or lower than $1\times10^{18}$ cm$^{-3}$, and the second dopant concentration is equal to or higher than $1\times10^{18}$ cm$^{-3}$ and equal to or lower than $1\times10^{20}$ cm$^{-3}$.

17. The semiconductor device according to claim 16, wherein

W2/(W1+W2) is equal to or smaller than ⅕, where W1 represents a length of the first portion in a direction along a contact surface with the second electrode and W2 represents a length of the second portion in a direction along a contact surface with the second electrode.

18. The semiconductor device according to claim 15, further comprising:

a fifth semiconductor region of the first conductivity type between the first semiconductor region and the fourth semiconductor region, and the fifth semiconductor region having a higher dopant concentration than the first semiconductor region.

19. The semiconductor device according to claim 18, wherein the first portion is in contact with the fifth semiconductor region and the second portion is not in contact with the fifth semiconductor region.

20. The semiconductor device according to claim 15, wherein the first portion is in contact with the first semiconductor region and the second portion is not in contact with the first semiconductor region.

* * * * *